(12) United States Patent
Lee et al.

(10) Patent No.: US 7,205,601 B2
(45) Date of Patent: Apr. 17, 2007

(54) FINFET SPLIT GATE EEPROM STRUCTURE AND METHOD OF ITS FABRICATION

(75) Inventors: Di-Hong Lee, Austin, TX (US);
Hsun-Chih Tsao, Hsin-Chu (TW);
Kuang-Hsin Chen, Jung-Li (TW);
Hung-Wei Chen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/148,903

(22) Filed: Jun. 9, 2005

(65) Prior Publication Data
US 2006/0278915 A1    Dec. 14, 2006

(51) Int. Cl.
*H01L 29/788* (2006.01)
(52) U.S. Cl. .................. 257/315; 257/314; 257/317; 257/319; 257/321; 257/347; 257/E29.129; 257/E29.3; 257/E29.304; 257/E29.309; 438/283
(58) Field of Classification Search .......... 257/315
See application file for complete search history.

(56) References Cited
U.S. PATENT DOCUMENTS

| 6,413,802 B1 | 7/2002 | Hu et al. |
| 6,465,836 B2 | 10/2002 | Lin et al. |
| 6,855,990 B2 * | 2/2005 | Yeo et al. ............... 257/353 |
| 2003/0042531 A1 | 3/2003 | Lee et al. |
| 2005/0266638 A1 * | 12/2005 | Cho et al. ............... 438/257 |

* cited by examiner

*Primary Examiner*—Minhloan Tran
*Assistant Examiner*—Eduardo A. Rodela
(74) *Attorney, Agent, or Firm*—Slater & Matsil, L.L.P.

(57) ABSTRACT

A FinFET split gate EEPROM structure includes a semiconductor substrate and an elongated semiconductor fin extending above the substrate. A control gate straddles the fin, the fin's sides and a first drain-proximate portion of a channel between a source and drain in the fin. The control gate includes a tunnel layer and a floating electrode over which are a first insulative stratum and a first conductive stratum. A select gate straddles the fin and its sides and a second, source-promixate portion of the channel. The select gate includes a second insulative stratum and a second conductive stratum. The insulative strata are portions of a continuous insulative layer covering the substrate and the fin. The conductive strata are electrically continuous portions of a continuous conductive layer formed on the insulative layer.

20 Claims, 9 Drawing Sheets ns between the source and drain, that degrade the ability of the gate to turn the device "on" or "off." This degradation is often referred to as the "short channel effect," or SCE.

FINFET SPLIT GATE EEPROM STRUCTURE AND METHOD OF ITS FABRICATION

TECHNICAL FIELD

The present invention relates to a split gate FinFET EEPROM structure and to a method of fabricating the structure. More specifically, the embodiments of the present invention combine FinFET technology and split gate EEPROM technology to obtain the benefits of both technologies in a single flash memory structure. Other embodiments of the invention relate to methods for fabricating the foregoing flash memory structure.

BACKGROUND

Numerous conventional techniques exist for fabricating transistors, such as FETs, and integrated circuits containing FETs. See commonly assigned U.S. Pat. No. 6,465,836 and prior art referred to therein (the "'836 patent"). Similarly, there exist numerous conventional IC techniques for fabricating non-volatile, erasable memories, such as EEPROMs ("flash memories"), the data storage and transduction capabilities of which are not based on transient operation, as is the case with bipolar junction transistors. Moreover, the fabrication of split gate FET EEPROMs fabricated by IC techniques is known.

A split gate FET EEPROM is similar to a conventional FET EEPROM. Similar to the latter, it includes a source/drain channel region, which has formed thereover a control or select gate overlying the channel. The control gate includes a control gate electrode separated from the channel by a control gate dielectric or oxide. A split gate EEPROM includes the control gate and also includes an electrically "floating" gate that overlies only a portion of the channel. An electrode of the floating gate is separated from the channel by a tunneling dielectric or oxide layer. The tunneling dielectric layer permits the passage therethrough of carriers (electrons or holes) by Fowler-Nordheim ("FN") tunneling and hot carrier injection. The floating gate electrode is beneath the control gate electrode and is separated therefrom by one or more insulative or dielectric layers.

Selected voltages are applied to the control gate electrode and to the source/drain to induce charge, reduce charge or sense charge in the floating electrode in order to write, erase or read the charge therein.

Prior techniques for fabricating FET EEPROMs are complicated and costly and often produce memories that do not operate appropriately, as noted in the '836 patent.

FinFETs are also known in the art. A FinFET includes an extended semiconductor fin that is elevated above a substrate in a direction normal to the plane of the substrate. Electrically continuous gates are fabricated on both sides of the fin and overlie both sides of a channel region defined between a source/drain that is formed in the fin, typically by ion implantation followed by rapid thermal annealing ("RTA"). It may be said that a FinFET includes a "double gate," one on either side of the channel in the fin. See the '836 patent.

FET technology is presently dominant in the fabrication of transistors, memories and other devices. Performance enhancement in more recent generations of devices is generally achieved by reducing device size, often termed "scaling," which results in faster device speed. However, as FETs are scaled to possess channel lengths less than 100 nm, their conventional stacked or horizontal orientation may lead to several problems, including unwanted coupling or interac- FETs fabricated by semiconductor-on-insulator, or "SOI," techniques are typically formed on an insulative layer covering a semiconductor layer, unlike "bulk" FETs, which are formed directly on substrates. SOI techniques have been found to reduce unwanted coupling between the source and the drain, because all of the semiconductor in the channel region can be inverted or depleted by the gate. However, as further scaling has occurred and the distance between the source and the drain has been reduced, interactions among the source, drain and the channel have increased, exacerbating SCE. The double gate of a FinFET allows control of the channel from both of its (and the fin's) sides and has been found to reduce SCE. Moreover, when the device is turned "on" using both gates, two conduction or inversion layers are formed in the channel, allowing for increased current flow therein.

In a recently developed FinFET structure, the gate straddles or wraps around the fin so that it nearly completely surrounds the channel. This has been found to further enhance gate control. See U.S. Pat. No. 6,413,802 (the "'802" patent) and prior art referred to therein A combined EEPROM-FinFET structure is shown by US Published Application 2003/0042531 (the "'531 publication"). This combination is intended to take advantage of the benefits of both types of devices as scaling continues. However, a split gate EEPROM structure is not implemented in the device of the '531 publication.

The present invention contemplates the convenient and expedient combination of FinFET technology and split gate EEPROM technology in an SOI device.

SUMMARY OF THE INVENTION

The present invention contemplates a split gate, FinFET EEPROM structure implemented according to SOI protocols, although bulk protocols are also contemplated.

An elongated, elevated semiconductor fin is formed or deposited on an insulative layer residing on a semiconductor substrate. An opposed source and drain are formed in the fin to define a channel or active area therebetween. A multi-layered stack straddles or surrounds the fin and a first portion of the channel. The stack includes a tunnel layer that resides on the fin and overlies the first channel portion and a floating electrode on the tunnel layer. A first electrically insulative stratum overlies the stack, and a first electrically conductive stratum resides on the first insulative stratum. A second insulative stratum covered with a second electrically conductive stratum straddles or surrounds the fin and overlies a second portion of the channel.

In preferred embodiments, the insulative strata are portions of an insulative overlayer that covers the stack, the portions of the fin (including the second channel portion) not covered by the stack, and portions of the insulative layer not covered by the stack and the fin. The first insulative stratum may be separated from the control electrode by an insulative coating on the electrode. It is also preferred that the electrically conductive strata are electrically continuous portions of a conductive overlayer on the insulative overlayer that overlies the stack and the second channel portion.

The second conductive stratum, the second insulative stratum and the second channel portion constitute a select transistor. The first conductive stratum, the stack and the first channel portion constitute a memory transistor.

CMOS protocols, involving deposit/form and etch/remove photolithographic or functionally equivalent techniques are utilized to fabricate the foregoing structure.

DETAILED DESCRIPTION OF ILLUSTRATIVE EMBODIMENTS

Figure 1:
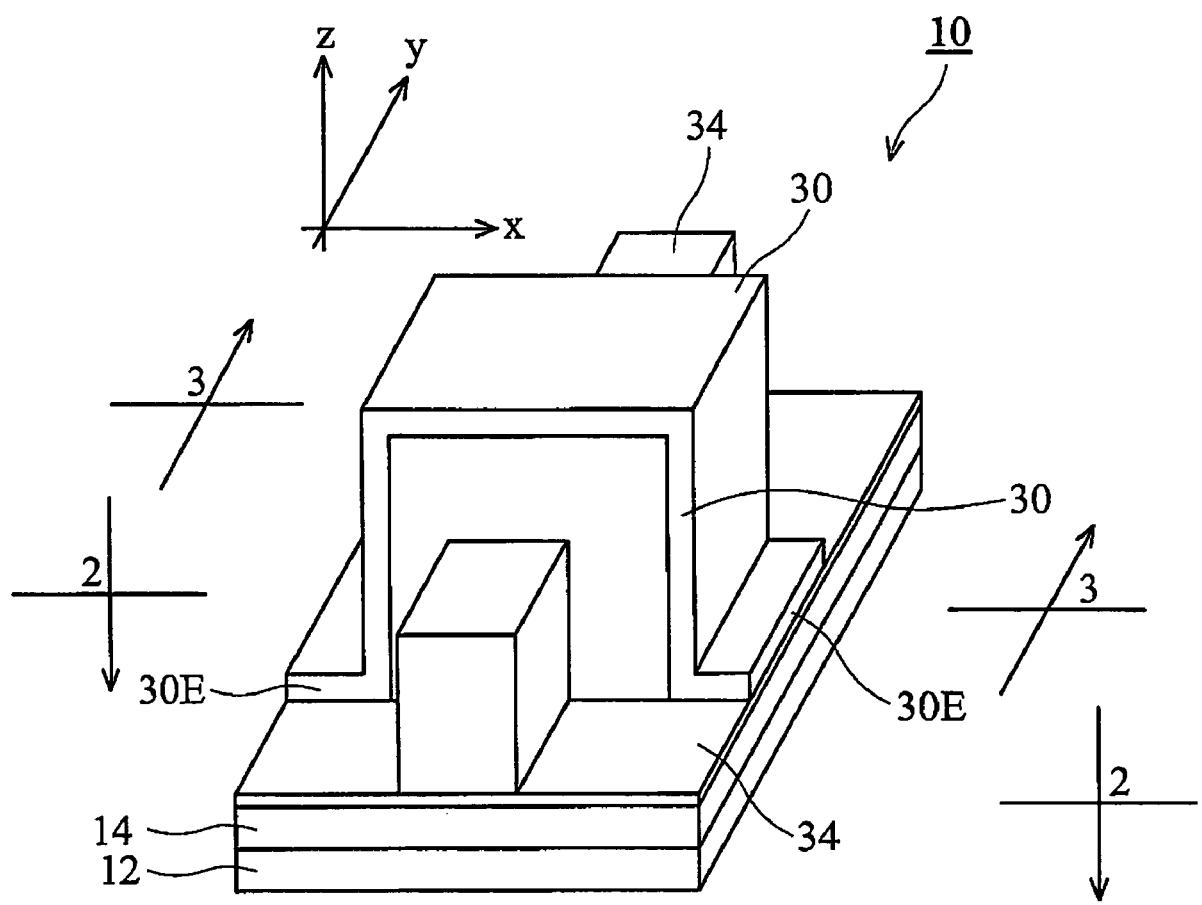
FIG. 1 is a perspective view of an embodiment of a split gate FinFET EEPROM device having a structure, and fabricated in accordance with a method, according to the principles of the present invention.

The Figures referred to herein are not to scale. The relative dimensions of the various elements depicted in the drawings are not intended to represent the actual dimensional proportionality of these elements, but are, rather, merely intended to clearly set forth for the benefit of those having ordinary skill in the art how to make and use, as well as the inventive concepts underlying, the present invention.

Figure 2:
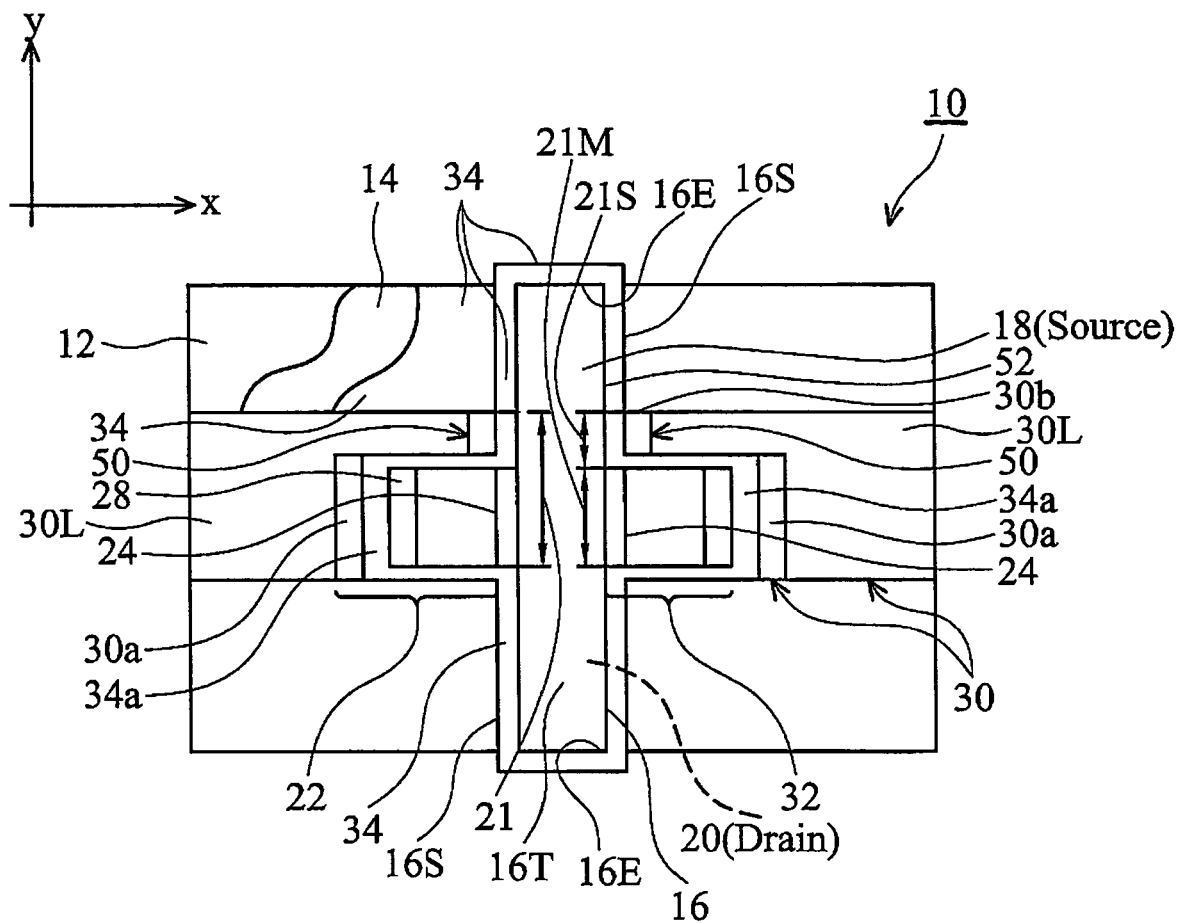
FIG. 2 is a top sectioned view of the device structure of FIG. 1 taken along line 2—2 thereof.
Figure 3:
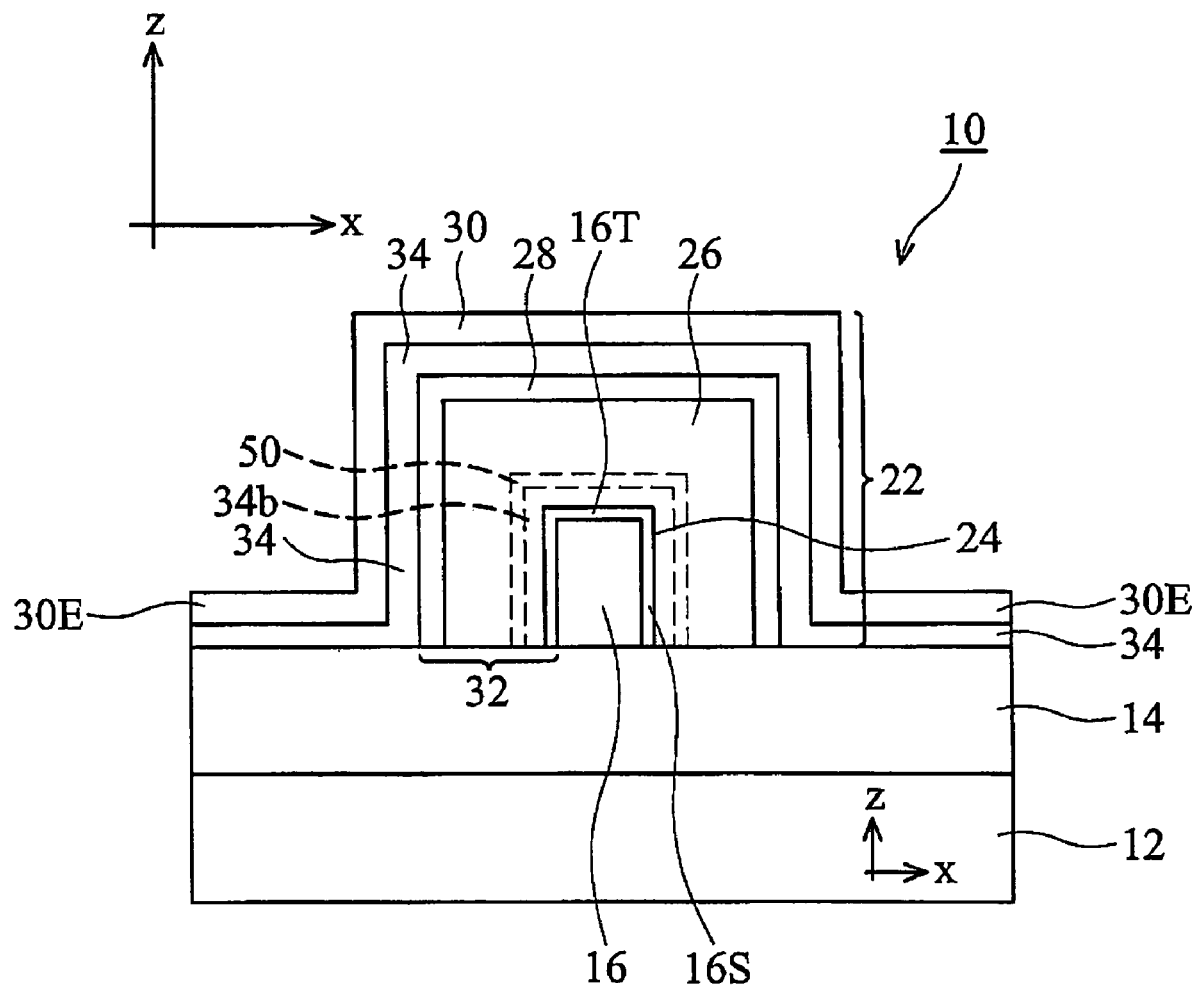
FIG. 3 is a sectioned front view of the device structure of FIGS. 1 and 2 taken along line 3—3 in FIG. 1.

Referring first to FIGS. 1–4, and particularly to FIGS. 2 and 3, there is generally shown an embodiment of a split gate FinFET EEPROM structure 10 as contemplated by the present invention. The structure 10 is preferably fabricated according to conventional deposit/form-and-etch/remove CMOS protocols. The split gate FinFET EEPROM 10 is preferably an SOI structure, although bulk procedures are also contemplated.

The structure 10 includes a generally planar semiconductor substrate 12, for example of silicon, on which there is formed or deposited an insulative film or layer 14, for example of silicon dioxide. The insulative film 14 may be conventionally formed or deposited.

As noted above, FIGS. 2 and 3 are sectioned views of the structure 10 taken respectively along lines 2—2 and 3—3 in FIG. 1. Referring now to FIGS. 2 and 3, in which X, Y and Z coordinates are indicated, a narrow, vertical fin 16 of a semiconductor, such as silicon, is formed on the insulative film 14 by deposit-and-etch techniques or other conventional photolithographic procedures. The fin 16 has a thickness of about 10 nm to about 100 nm, is elongated in the Y-direction, and is elevated above the free surface of the insulative film 14, having a height of about 10 nm to about 100 nm in the Z-direction. The fin 16 has sides 16S in the Y,Z plane; the sides 16S are generally normal to the X,Y plane of the substrate-film 12–14. The fin 14 has a top surface 16T in the X,Y plane; the top 16T is elevated in the Z-direction above the free surface of the insulative film 14. The fin 16 has end surfaces 16E in the X,Z plane.

Within the fin 16 beginning at or near its respective end surfaces 16E and extending toward each other are formed source and drain regions 18 and 20. The source and drain 18 and 20 may be formed by any appropriate conventional process such as ion implantation followed by rapid thermal annealing ("RTA"). A channel or active region 21 is defined within the fin 16 between the source 18 and the drain 20.

An inverted, "U"-shaped control gate structure, generally indicated at 22, substantially conformally straddles the sides 16S and top 16T of a central portion of the fin 16 and surrounds or overlies a first portion 21M of the channel region 21 that is nearer to the drain 20. The control gate structure 22 includes a high quality, thin dielectric/insulative tunnel layer 24; a floating electrode 26, comprising a conductive material such as polysilicon, a metal-containing material or quantum dots; an optional dielectric/insulative coating 28 on the floating electrode 26; and a first portion or stratum 30a of an electrically conductive outer layer 30 of polysilicon, metal or other conductive material. A first portion or stratum 34a of an insulative/dielectric outer layer 34 separates the coating 28 (if present) from the first conductive stratum 34a. More details about the outer layer 34 are set forth below.

The tunnel layer 24, the floating electrode 26, and the coating 28 (if present) constitute an inverted "U"-shaped, congruent stack 32 that straddles and surrounds the fin 16. The tunnel layer 24, the floating electrode 26 and the coating 28 of the stack 32 are generally congruent with each other and with the first channel portion 21M. The conductive stratum 30a is aligned with the stack 32 and the first channel portion 21M, but may be slightly wider than the stack 32 due to the thickness on the sides of the stack 32 in the Y-direction of the outer insulative layer 34 separating it in the X-direction from the stack 32.

The tunnel layer 24, which functions as a gate tunnel dielectric, may comprise a thin, high-quality layer about 3 nm to about 10 nm thick (preferably about 8 nm) of silicon dioxide, $Si_3N_4$, $HfO_2$, $Al_2O_3$, or any other material suitable as a tunnel dielectric. The tunnel layer 24 is conformally formed on the sides 16S and the top 16T of the fin 16 congruently with the first channel portion 21M, straddling the fin 16 in an inverted "U" configuration, and residing generally centrally between the ends 16E of the fin 16 over the first channel portion 21M.

The floating electrode 26, is a conventionally formed or deposited layer of polysilicon, metal or other suitable conductive material or metal-containing material, and may have a thickness of about 20 nm to about 100 nm. The floating electrode 26 is conformally formed on, and in congruence with, the tunnel layer 24, and similarly straddles the fin 16 and the first channel portion 21M. The floating electrode 26 may also comprise a matrix of conductive quantum dots or nanospheres, as described in commonly assigned, U.S. Patent application TSMC2003-0513, Ser. No. 11253472, filed Oct. 19, 2005, and prior art cited therein, incorporated herein by reference.

The insulative coating 28 is formed or deposited on the floating electrode 26 by conventional methods to a thickness of about 5 nm to about 30 nm. The coating 28 may comprise silicon dioxide, oxynitride, nitride-oxide, oxide-nitride-oxide ("ONO"), or a high-K dielectric material, including a metal oxide or silicate. The coating 28 may be a single layer or multi-layered.

The conductive outer layer 30 includes a first portion or stratum 30a, which functions as a control electrode. The control electrode 30a overlies the stack 32, and is separated therefrom by the first insulative stratum 34a. The first conductive stratum 30a and the conductive outer layer 30, of which it is a portion, have a thickness of about 20 nm to about 100 nm. The conductive outer layer 30 includes contiguous portions or legs 30L that extend away in the X-direction from the fin 16 and the stack 32 parallel to the substrate-film 12–14 and reside on the free surface of the outer insulative layer 34, which constitutes an area layer on the free surface of the film 14. The conductive stratum 30a, therefore, straddles the fin 16, the first channel portion 21M, and the stack 32 and is depicted as being slightly wider than the stack 32 in the Y-direction, although smaller or larger Y-direction dimensions of the stratum 30a are contemplated. The outer conductive layer 30 and its extending legs 30L may have the same Y-dimension as shown.

The conductive outer layer 30 also includes an inverted "U" portion or extension 30b that is electrically continuous with the legs 30L of the outer layer 30. The portion or extension 30b, which functions as a select electrode 50, overlies a second portion 21S of the channel 21 nearer to the source 18, straddling and surrounding the fin 16 and the channel portion 21S. The extension/select electrode 30b/50 is separated from the channel portion 21S and the sides 16S and top 16T of the fin 16 only by a second portion or stratum 34b of the outer insulative layer 34. The extension 30b/50 of the outer conductive layer 30 and the underlying insulative stratum 34b function as a select gate structure 52.

After the stack 32 is formed, but before the outer conductive layer 30 is formed, the outer insulative layer 34 is deposited or formed by conventional methods conformally over the stack 32, the sides 16S, top 16T and ends 16E of the fin 16 not straddled by the stack 32, and the free surface of the film 14 not covered by the fin 16 or the stack 32. The outer insulative layer 34 may be silicon dioxide, oxynitride, nitride-oxide, oxide-nitride-oxide ("ONO"), or a high-K dielectric material, including a metal oxide or silicate and may have a thickness of about 3 nm to about 10 nm. After the outer insulative layer 34 is formed or deposited, the outer conductive layer 30, including its legs 30L and the strata 34a and 34b (or extension 50) thereof, is formed or deposited thereover.

Figure 4A:
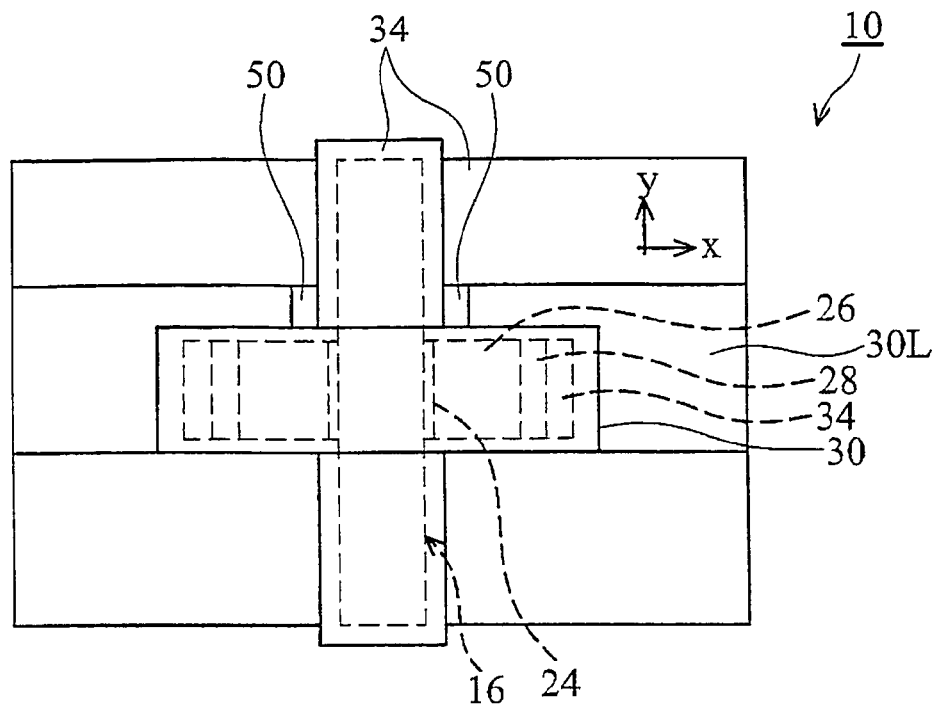
FIGS. 4(A)–4(C) are, respectively, a top, front and side view of the split gate FinFET EEPROM device shown in FIGS. 1–3 illustrating by means of hidden lines the details of the structure of the device.
Figure 4B:
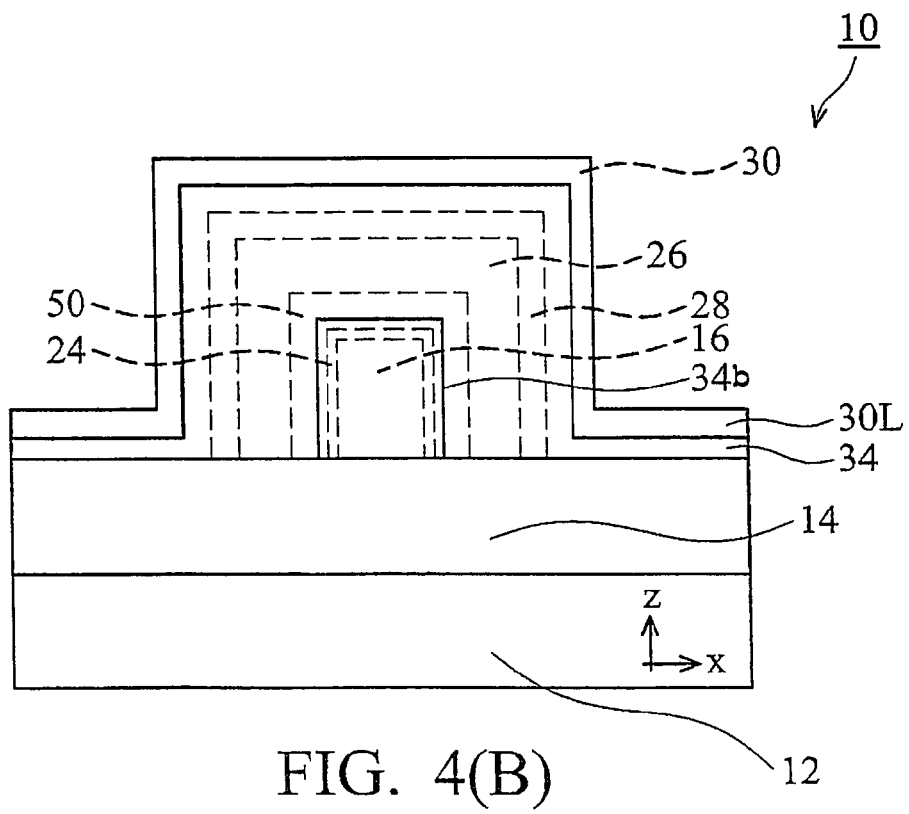
Figure 4C:
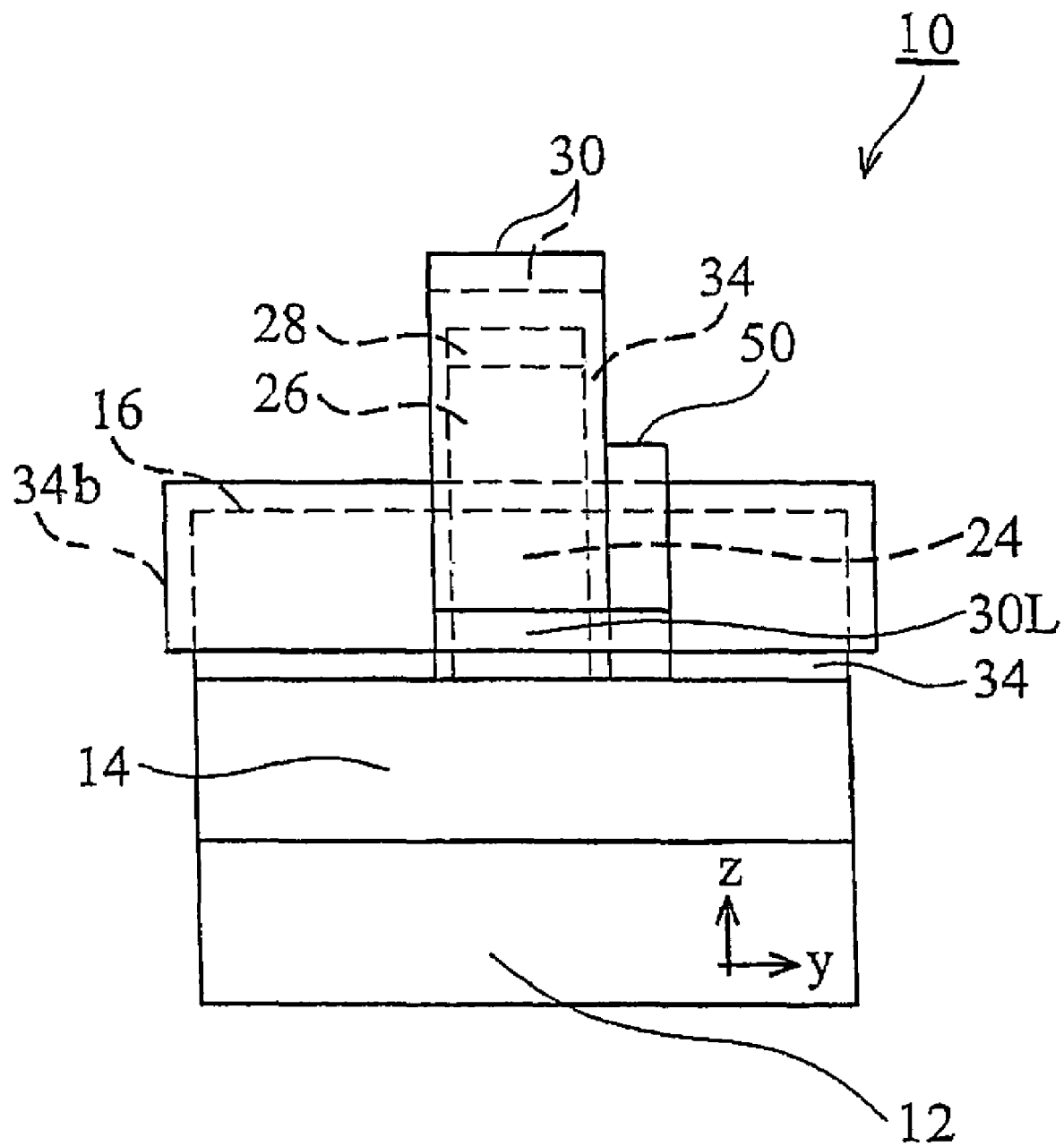

Detailed front, top and side views of the structure 10 in FIGS. 1–3, including hidden lines, are shown in the orthographic projections of FIGS. 4(A)–4(C).

As depicted in FIGS. 1–4(C), the structure 10 functions as a split gate EEPROM. Specifically, appropriate voltages are applied to the select electrode 30b/50 and the control electrode 30a (via the legs 30L), and to the source/drain 18/20. Appropriate voltage application to the source/drain 18/20 and to the select electrode 30b/50 effects source-side carrier injection into the portion 21S of the channel 21. Voltage on the control electrode 30b induces, reduces or senses charge stored in the floating electrode 26, in order to write, erase or read such charge.

During a write operation, the floating electrode 26 is charged by hot carrier injection and/or by FN tunneling from the channel 21 through the tunnel layer 24. During an erase operation, the floating electrode 26 is discharged by FN tunneling through the tunnel layer 24 to the channel 21. During a read operation the level of the current flowing from the source 18 to the drain 20 is sensed. Specifically, during a read operation: (a) following an erase operation, a high current will flow from the source 18 to the drain 20 and a "1" will be sensed; (b) following a write operation, low or no current will flow from the source 18 to the drain 20, and a "0" will be sensed.

Because the structure 10 is a FinFET, the advantages thereof—such as those regarding the presence of a double gate, SCE reduction, lower voltages for programming and erase operations, and increased current flow—may be realized in the EEPROM 10. The split gate nature of the structure 10 invests it with advantages such as higher read currents and immunity from over-erase. The fin 16 and the split gate 22/52 lead to an EEPROM having high programming efficiency and low write currents. Thus, numerous advantages are realized by combining in the device structure 10 SOI protocols, FinFET technology, and split gate technology.

Figure 5A:
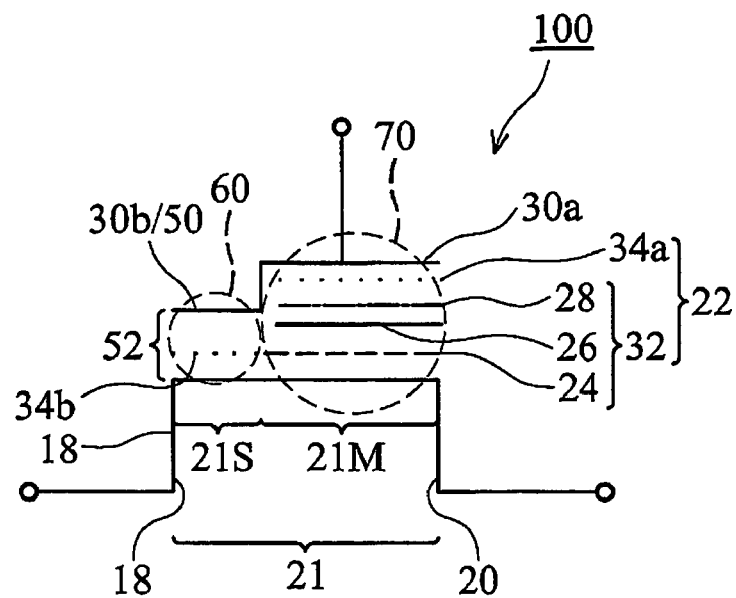
FIGS. 5A and 5B are electrical schematics of the device of FIGS. 1–4(C) illustrating that the device includes combined select and memory transistors constituting the split gate FinFET EEPROM structure of the present invention.
Figure 5B:
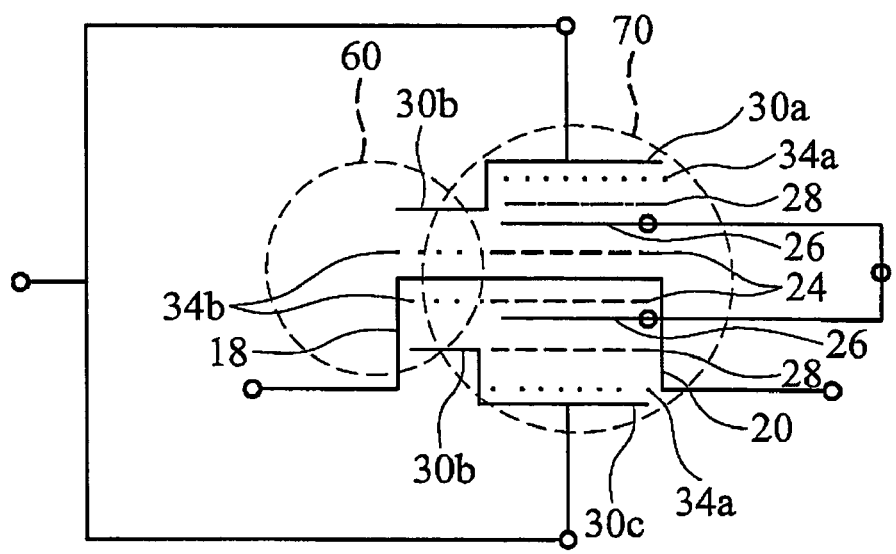

Electrical schematics of the structure 10 are presented in FIGS. 5A and 5B. FIG. 5A is a simplified version of FIG. 5B, which illustrates both the electrical and physical characteristics of the structure 10. The cooperation of the select gate 52—comprising the extension 30b/50 and the underlying insulative stratum 34b of the outer layer 34—with the channel portion 21S and the source/drain 18/20 effectively comprises a select transistor 60. The cooperation of control gate 22—the control electrode 30a, the insulative stratum 30a (and the insulative coating 28, if used), the floating electrode 26 and the tunnel layer 24—with the channel portion 21M and the source/drain 18/20, in effect, comprises a memory transistor 70. The gate structures 22 and 52 are thus conveniently fabricated by CMOS protocols as side-by-side entities, as are their transistors 60 and 70.

Figure 6:
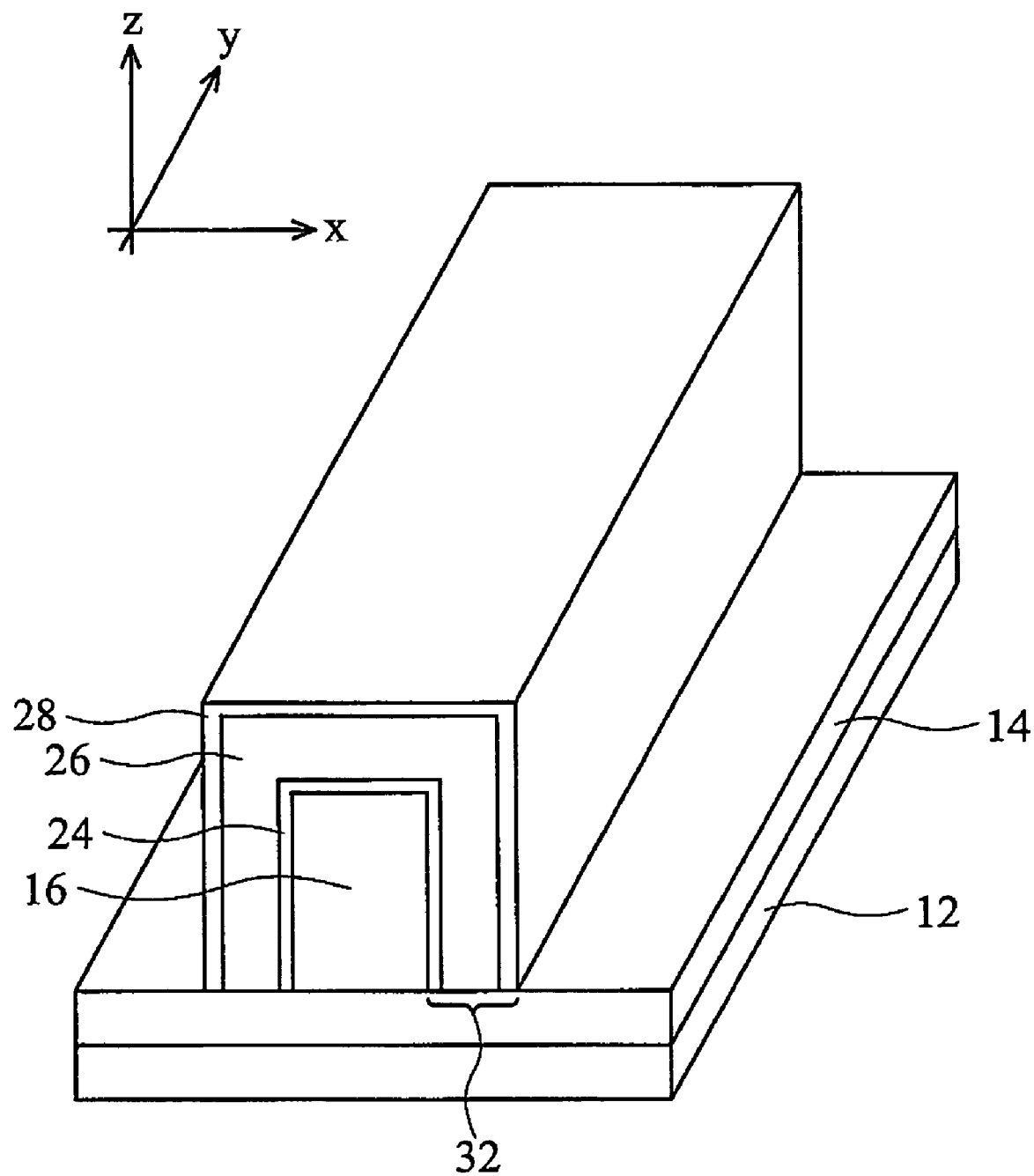
FIGS. 6–8 are perspective views showing, in conjunction with FIG. 1, the in-process device structure of FIGS. 1–5 at various stages of its fabrication.
Figure 7:
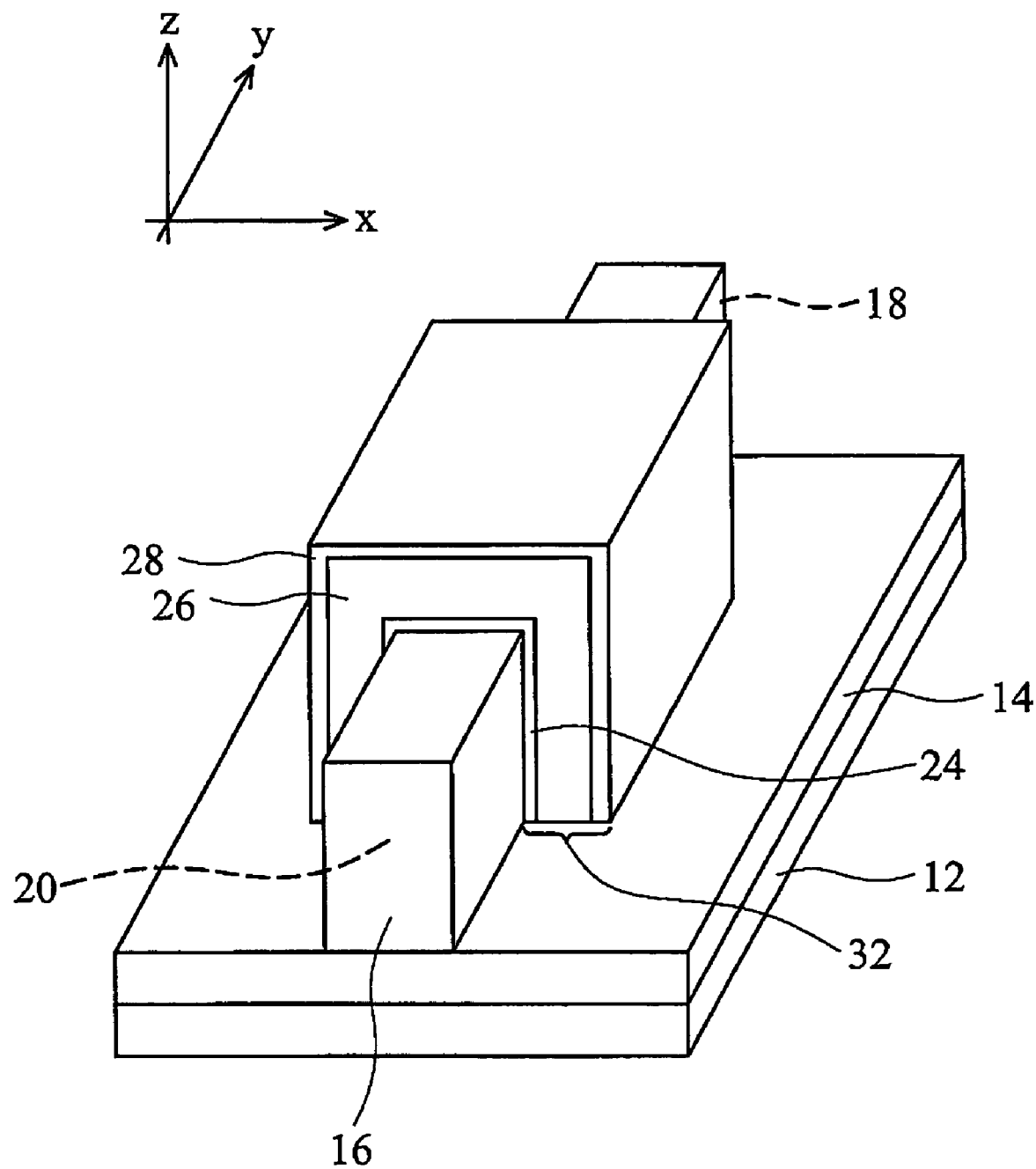
Figure 8:
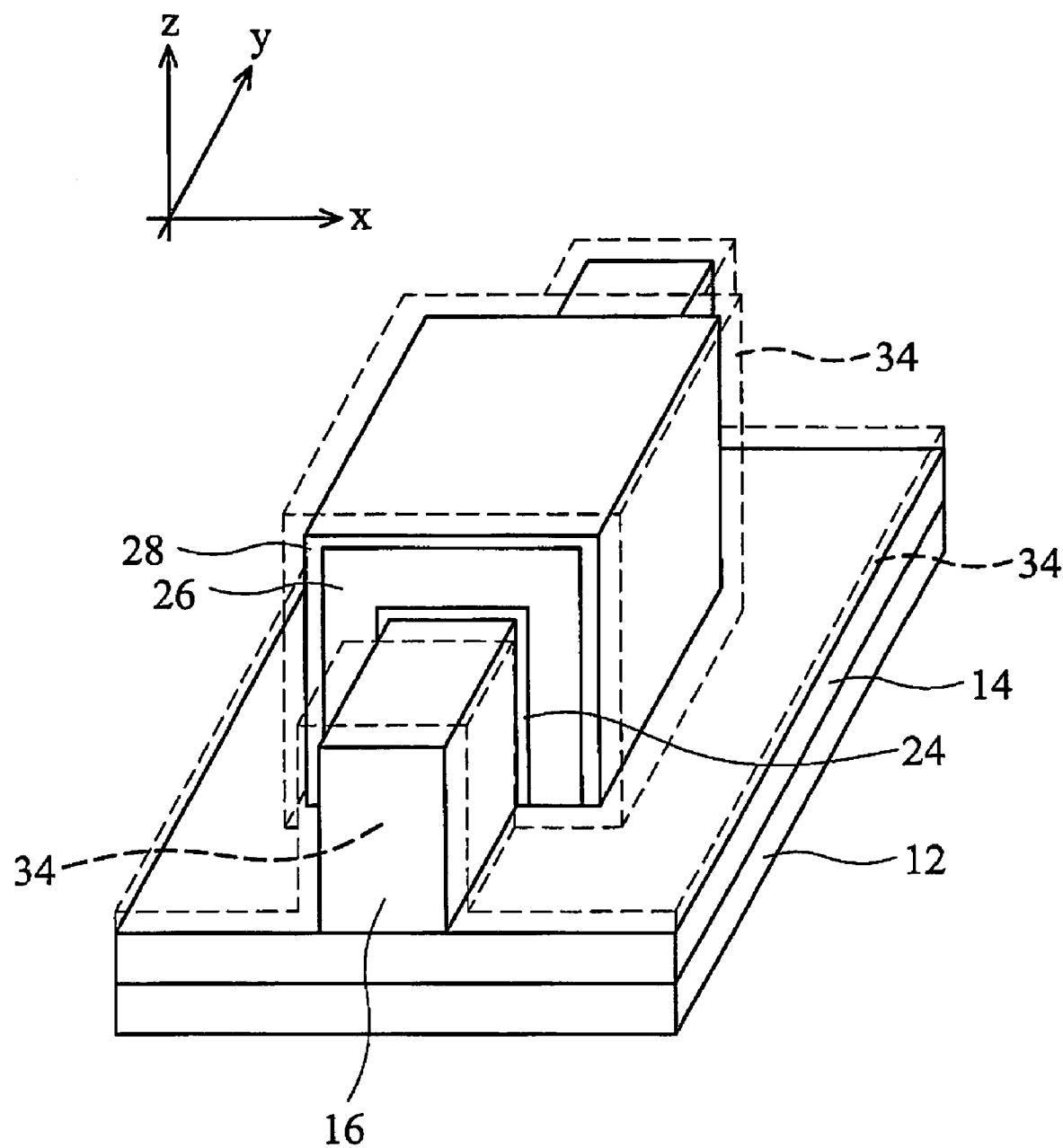

As already noted, the structure 10 is preferably fabricated according to CMOS SOI protocols, as should be obvious from the foregoing description and as shown in FIGS. 6–8 taken with FIG. 1

FIG. 6 depicts the first five steps of a method of fabricating the structure 10. Specifically, after the layer 14 is formed or deposited on the substrate 12, the fin 16 is formed or deposited on the layer 14. The fin- and channel-surrounding layers 24, 26 and 28—the stack 32—are then formed or deposited in order over the fin 16. Next, FIG. 7, portions of the stack 32 are selectively removed so that the stack 32 overlies only the incipient channel portion 21M. Following this, ion implantation and RTA are employed to form the source and the drain 18 and 20 in the fin 16, with the channel portion 21M being overlaid by the stack 32 and the channel portion 21S not being overlaid by the stack 32. Next, FIG. 8, the entire in-process structure, including the channel portion 21S, is covered with the outer insulative layer 34. Last, FIG. 1, the outer conductive layer 30, including the extension 50 overlying the channel portion 21S is formed or deposited. Subsequently, selective removal of portions of the outer insulative layer 30 overlying the source 18 and the drain 20 may be effected to permit the connection thereto of appropriate contacts for application thereto of operating voltages.

Particular embodiments of the invention are described herein. It is to be understood that the invention is not limited in scope thereby. The present invention includes the described embodiments and any modifications and equivalents covered by the following claims hereof.

What is claimed is:

1. A finFET split gate EEPROM structure, comprising:
an elongated, elevated semiconductor fin having a source and a drain formed therein to define a channel therebetween;
a control gate structure straddling the fin and overlying a first portion of the channel, the control gate structure comprising
a tunnel layer on the fin,
a floating electrode on the tunnel layer,
a first insulative stratum over the floating electrode, and
a first conductive stratum on the first insulative stratum; and a select gate structure straddling the fin and overlying a second portion of the channel, the select gate structure comprising
a second insulating stratum on the fin, and
a second conductive stratum on the second insulative stratum, the second conductive stratum and the first conductive stratum being contiguous portions of a continuous conductive layer.

2. A structure as in claim 1, wherein:
the control gate structure and the first channel portion constitute a memory transistor; and
the select gate structure and the second channel portion constitute a select transistor.

3. A structure as in claim 1, wherein:
the tunnel layer is a thin, high-quality layer $SiO_2$, $Si_3N_4$, $HfO_2$, or $Al_2O_3$;
the floating electrode is a layer of conductive polysilicon, a conductive metal-containing material, or a matrix of conductive quantum dots or nanospheres;
the insulative strata are silicon dioxide, oxynitride, nitride-oxide, oxide-nitride-oxide, or a high-K dielectric material; and
the conductive strata are polysilicon or a conductive-metal-containing material.

4. A structure as in claim 1, which further comprises an insulative coating on the floating electrode between the floating electrode and the first insulative stratum.

5. A structure as in claim 4, wherein the insulative coating is silicon dioxide, oxynitride, nitride-oxide, oxide-nitride-oxide, of a high-K dielectric material.

6. A structure as in claim 1, wherein:
the first and second insulative strata are portions of a continuous outer insulative layer that resides on the control gate structure and on those surfaces of the fin not straddled by the control gate structure; and
the first and second conductive strata are electrically continuous portions of a continuous outer conductive layer that resides on the outer insulative layer.

7. A structure as in claim 6, which further comprises an insulative, planar, film-coated semiconductor substrate supporting the fin, the planes of the fin and the substrate being non-parallel, the insulative layer covering portions of the film not covered by the fin.

8. A structure as in claim 6, wherein:
the control gate structure and the first channel portion is capable of functioning as a memory transistor; and
the select gate structure and the second channel portion are capable of functioning as a select transistor.

9. A structure as in claim 6, wherein:
the tunnel layer is a thin, high-quality layer of $SiO_2$, $Si_3N_4$, $HfO_2$, or $Al_2O_3$;
the floating electrode is a layer of conductive polysilicon, a conductive metal-containing material, or a matrix of conductive quantum dots or nanospheres;
the outer insulative layer is silicon dioxide, oxynitride, nitride-oxide, oxide-nitride-oxide, or a high-K dielectric material; and
the outer conductive layer is polysilicon or a conductive metal-containing material.

10. A structure as in claim 6, which further comprises an insulative coating on the floating electrode between the floating electrode and the first insulative stratum.

11. A structure as in claim 6, wherein the insulative coating is silicon dioxide, oxynitride, nitride-oxide, oxide-nitride-oxide, or a high-K dielectric material.

12. A semiconductor structure, comprising:
a generally planar, thin semiconductor member having opposed major surfaces and a source and a drain formed therein to define therebetween a channel that is generally parallel to the major surfaces;
a control gate structure located on the major surfaces of the member so as to overlie both sides of a first portion of the channel, the control gate structure comprising
a tunnel layer on each major surface,
a floating electrode on each tunnel layer,
a first insulative stratum over each floating electrode, and
a first conductive stratum on each first insulative stratum; and
a select gate structure located on the major surfaces of the member so as to overlie a second portion of the channel, the select gate structure comprising
a second insulating stratum on each major surface, and
a second conductive stratum on each second insulative stratum, wherein the second conductive stratum and the first conductive stratum are contiguous portions of a continuous conductive layer.

13. A structure as in claim 12, which further comprises an insulative coating on each floating electrode between the floating electrode and is associated first insulative stratum.

14. A structure as in claim 12, which further comprises:
an outer insulative layer on each control gate structure and on the major surfaces of the member that are not covered by the select gate structure, each insulating layer including a respective insulative stratum as a portion thereof; and
an outer conductive layer on each insulative stratum, each layer including a respective conductive stratum.

15. A structure as in claim 14, wherein the tunnel layers, the floating electrodes, the outer insulative layers, and the outer conductive layers are portions of respective inverted, substantially "U"-shaped layers that straddle the member, the floating electrodes and the conductive strata being respectively electrically continuous.

16. A structure as in claim 15, wherein each second conductive stratum and a respective control gate structure are separated by a portion of the substantially "U"-shaped insulative layer.

17. A method of fabricating a split gate FinFET EEPROM on a planar semiconductor substrate, which comprises:
(a) covering the substrate with an insulative film;
(b) forming on the insulative film an elevated, extended semiconductor fin having opposed major surfaces that are not parallel with the plane of the substrate;
(c) forming a substantially "U"-shaped tunnel layer on the fin's major surfaces and over the top of the fin;
(d) forming a substantially "U"-shaped floating electrode on the tunnel layer;
(e) forming a separated source and drain in the fin to define therebetween a channel that is parallel to the fin's major surfaces so that the tunnel layer overlies a first portion of the channel;
(f) forming an outer insulative layer over the floating electrode, on the sides of the floating electrode and the tunnel layer, and on portions of the major surfaces and top of the fin not covered by the tunnel layer; and
(g) forming a continuous outer conductive layer on the insulative layer over both the first channel portion and over a second channel portion that is nearer to the source than to the drain.

18. A method as in claim 17, which further comprises: between steps (e) and (f), coating the floating electrode with an electrically insulative material.

19. A product made by the process of claim 18.

20. A method as in claim 17, wherein step (e) is effected by ion implantation.

* * * * *